US008238066B2

(12) United States Patent
Zylstra

(10) Patent No.: US 8,238,066 B2
(45) Date of Patent: Aug. 7, 2012

(54) CURRENT SENSOR FOR EARTH LEAKAGE MODULE

(75) Inventor: Henry J. Zylstra, Alburnett, IA (US)

(73) Assignee: Schneider Electric USA, Inc., Palatine, IL (US)

( * ) Notice: Subject to any disclaimer, the term of this patent is extended or adjusted under 35 U.S.C. 154(b) by 293 days.

(21) Appl. No.: 12/621,141

(22) Filed: Nov. 18, 2009

(65) Prior Publication Data

US 2011/0116197 A1 May 19, 2011

(51) Int. Cl.
 *H02H 3/16* (2006.01)
(52) U.S. Cl. .................... 361/42; 361/44
(58) Field of Classification Search .......... 361/42–50
 See application file for complete search history.

(56) References Cited

U.S. PATENT DOCUMENTS

| | | | | |
|---|---|---|---|---|
| 4,370,692 A | * | 1/1983 | Wellman et al. | 361/109 |
| 4,702,002 A | * | 10/1987 | Morris et al. | 29/837 |
| 5,828,282 A | | 10/1998 | Tiemann | 336/84 |
| 5,889,450 A | * | 3/1999 | Kim et al. | 335/18 |
| 6,507,260 B1 | * | 1/2003 | Baumann et al. | 336/90 |
| 7,161,455 B2 | * | 1/2007 | Tate et al. | 336/90 |
| 7,307,504 B1 | * | 12/2007 | Carlino et al. | 336/213 |

* cited by examiner

*Primary Examiner* — Danny Nguyen
(74) *Attorney, Agent, or Firm* — Nixon Peabody LLP

(57) ABSTRACT

A current sensor assembly used for detecting ground faults, which includes an enclosure surrounding the current sensor for focusing the magnetic flux produced by conductors passing through the current sensor assembly away from the conductors, thereby reducing load-shift error and producing more accurate current readings for ground-fault sensing. The enclosure has two half members that are secured together to form a toroid-shaped shell that surrounds a toroidal core of the current sensor. A secondary winding and an optional test winding is wound around the toroidal core, and the ends of these windings exit one or more apertures formed in the enclosure. The half members have rounded profiles where the flat surfaces transition into different planes so that the magnetic flux does not encounter any sharp edges or transitions inside the enclosure as the flux flows away from the conductors.

22 Claims, 4 Drawing Sheets

CURRENT SENSOR FOR EARTH LEAKAGE MODULE

FIELD OF THE INVENTION

The invention relates to current sensor assemblies, and more particularly, to an enclosure for a current sensor that reduces load-shift error.

BACKGROUND

When detecting earth leakage currents in a single- or three-phase electrical circuit, a sensitive current transformer is needed to sense accurately current from as low as 30 mA or lower to as high as 3.0 A. A high-permeability core is used to minimize the error contribution of the magnetic core. Existing ways of optimizing the sensing accuracy of the current transformer include using a high-permeability core and shaping the core like a toroid. Another problem that occurs in optimizing sensing accuracy is known as load shift, which is an error that causes the output of the current transformer to shift due to load current. The current transformer senses a different current with and without a load current, and this difference is combined with an actual ground-fault signal and can add or subtract from the true ground-fault signal. This can cause the circuit breaker in which the current transformer is located to trip too early or too late (usually the latter). Accordingly, the ground-fault detection circuitry to which the current transformer is coupled needs to compensate for the load shift on a sensor-by-sensor basis.

Load shift is caused at least in part by the unequal magnetic coupling to conductors to the current transformer. The present disclosure is directed to minimizing load shift as well as addressing other problems.

BRIEF SUMMARY

The present disclosure relates to a high-permeability shell that provides a path that equalizes the coupling to the magnetic core and windings from the current-carrying conductors passing through the core. The shell alters the field and the resulting magnetic flux such that it is more uniformly coupled into the core and coil. The requirements are quite severe—the error in coupling (between the conductors) should be on the order of 1 part in 10,000 and 1 part in 100,000. The shell also provides a path for magnetic flux from external magnetic fields generated by currents (other than the conductors) and thereby shields the core from this extraneous flux. A high-permeability shell that encloses the current transformer or sensor surrounds the toroidal (donut-shaped) core of the current sensor. The high permeability material of the shell results in a more uniform coupling of the magnetic fields from each of the conductors to the core and winding. Like electrical current, magnetic flux also prefers to the take the path of least resistance, so when presented with a high-permeability material, the flux will tend to prefer to pass through the high-permeability material. The farther away the flux travels from the conductors, the weaker the flux becomes, and so if any flux does couple back to the conductors, it is significantly weakened and contributes less significantly to load shift.

The shell is shaped like a toroid, slightly larger than the toroidal core of the current sensor so that it can completely enclose or surround the toroidal core. The shell has a continuous rounded outer surface so that there are no sharp transitions or seams that would discourage the magnetic flux from passing through the shell. The shell, which can be made of steel, also provides mechanical protection for the windings of the sensor and for the sensor itself. It can be made of two minor-image pieces that resemble half of a hollow donut cut in half lengthwise, and the two halves are placed around the toroidal core of the sensor and secured together. An enclosing shell constructed in this manner with rounded corners provides unexpected improvements in load-shift error. As a result, the current sensor is capable of more accurate ground-fault sensing and is less susceptible to load shift.

BRIEF DESCRIPTION OF THE DRAWINGS

The foregoing and other advantages of the invention will become apparent upon reading the following detailed description and upon reference to the drawings.

Figure 1:
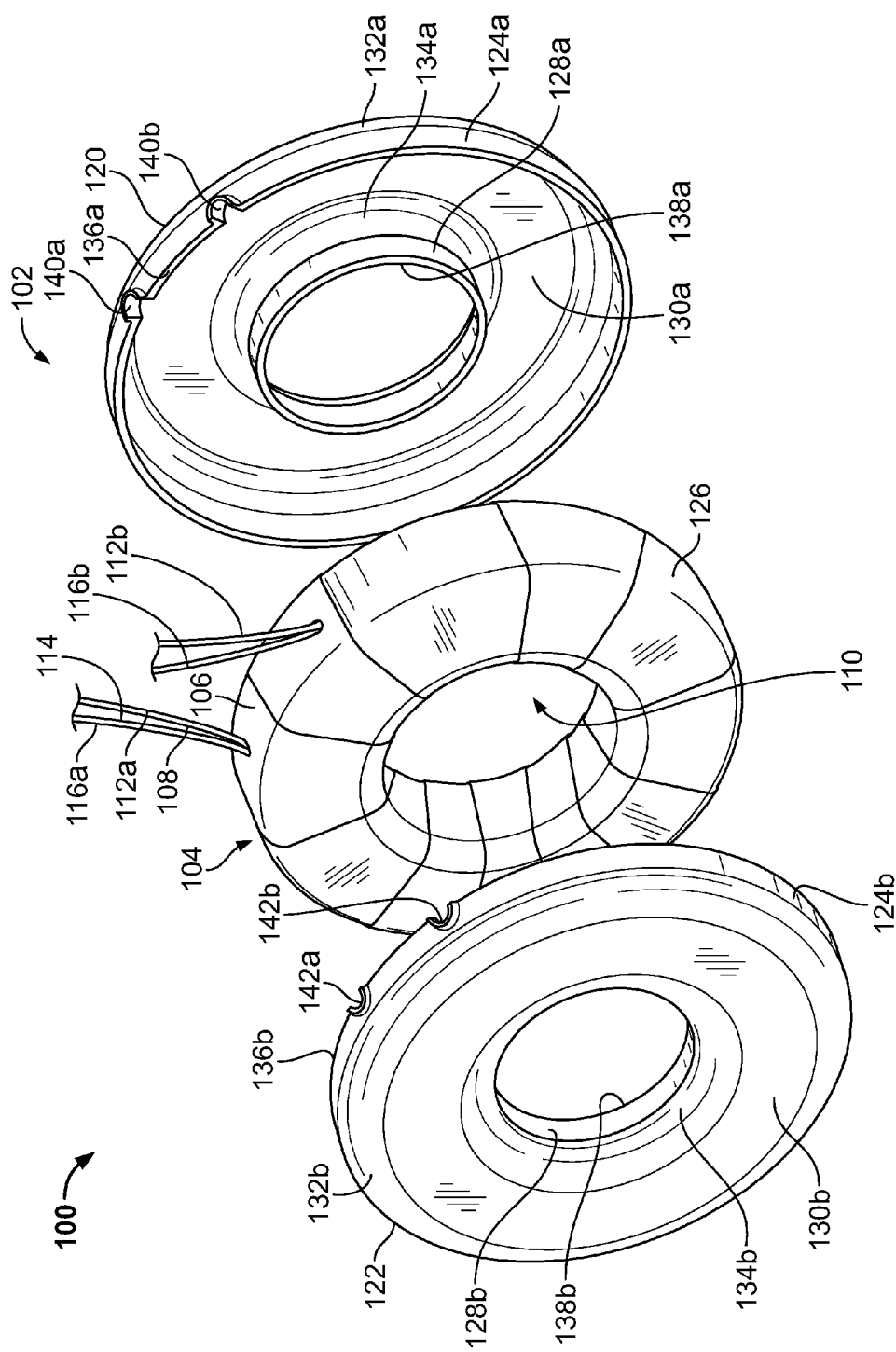
FIG. 1 is an exploded diagram of a current sensor assembly including two half members of an enclosure that surrounds the current sensor according to an aspect of the present disclosure.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Figure 4:
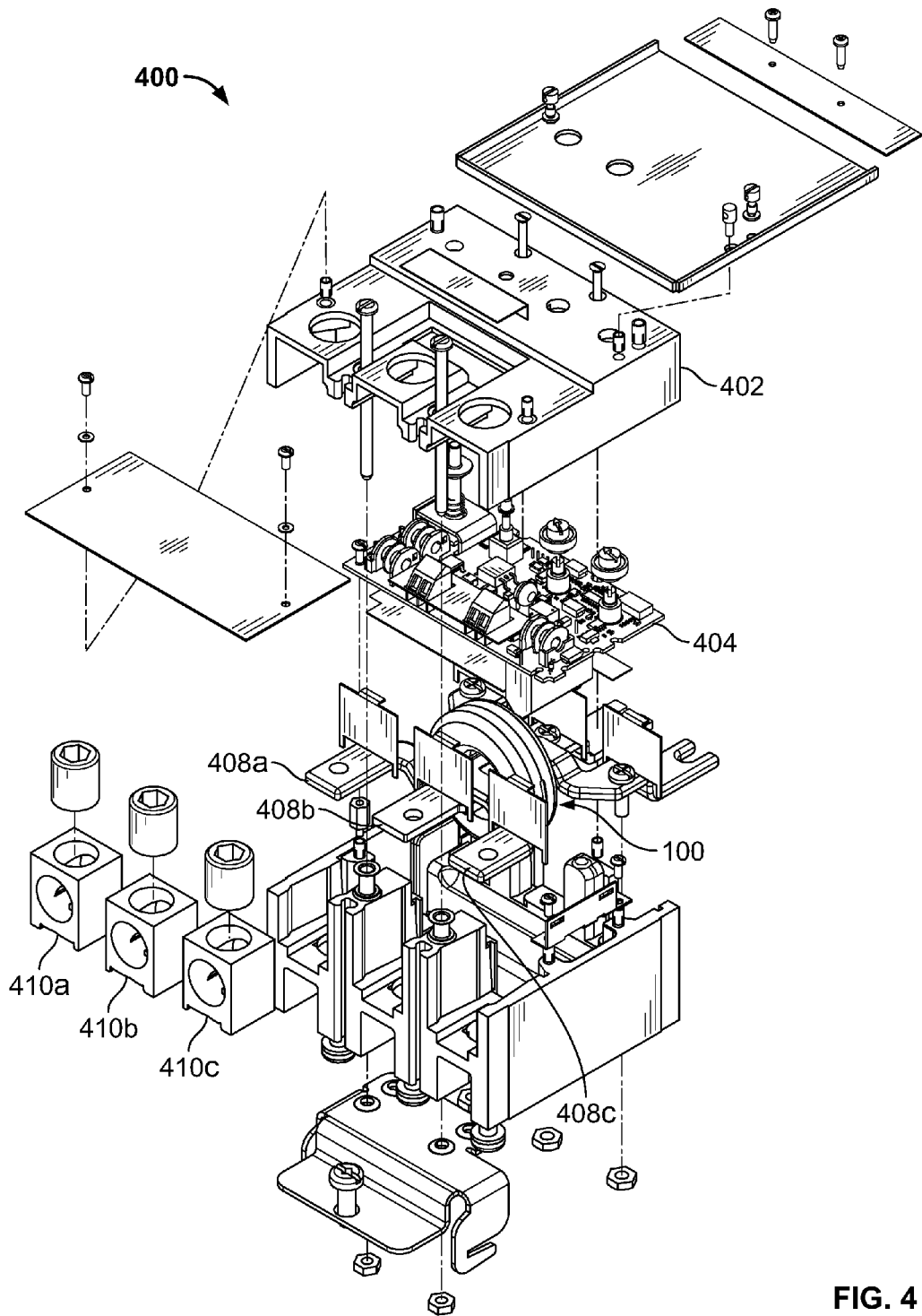
FIG. 4 is an exploded diagram of a portion of a ground fault module in which the current assembly of FIG. 1 is installed with three conductors passing through the central opening of the current sensor assembly.

FIG. 1 is an isometric, exploded view of a current sensor assembly 100 for sensing ground-fault current. The current sensor assembly includes a shell or enclosure 102 that encloses or surrounds a toroidal core 106 of the current sensor 104. The core 106 is conventionally shaped like a toroid and includes a central opening 110 formed through its center. With the exception of one or more apertures formed in the shell 102 described below, the shell 102 completely surrounds or encloses the toroidal core 106, including the central opening 110 of the toroidal core 106 through which conductors carrying electrical current are received. The conductors are not shown in FIG. 1 for ease of illustration (they are shown in FIG. 4 as conductors 408a,b,c), but conventionally they are received through the central opening 110 of the core 106 as shown in FIG. 4. Typically, two or three conductors are received through the central opening 110, though more than three can be present as well. A secondary winding 108 composed of an electrically conductive wire is conventionally wound around the toroidal core 106. The secondary winding 108 has a pair of ends 112a, 112b that are connected to a ground-fault detection circuit, shown and described below. Optionally, a test winding 114 composed of an insulated wire is also wound on the core 106. The test winding 114 has a pair of ends 116a, 116b that are also connected to the ground-fault detection circuit.

The shell or enclosure 102 includes a first half member 120 and a second half member 122. In FIG. 1, the half members 120, 122 have been separated to reveal the toroidal core 106, but during assembly, the half members 120, 122 are positioned adjacent one another to form a toroid that surrounds the toroidal core 106 of the current sensor 104. The first half member can be a mirror-image of the second half member for ease of manufacturing. For example, the first and second half members can be composed of steel and formed by metal stamping. Only one half needs to be stamped, requiring only one mold or die to construct a complete shell 102. The first and second half members 120, 122 are composed of a high-permeability magnetic material having a permeability of at least 700 H/m, and preferably 1000 H/m, or greater. The high-permeability magnetic material equalizes the coupling of the magnetic field and magnetic flux in the core 106 and also shields the core 106 from extraneous magnetic fields. The core 106 can also be composed of a high-permeability magnetic material, such as nickel-iron, which further minimizes the load-shift performance of the core 106. The load-shift performance can be further minimized by ensuring as uniform a distribution of the secondary winding 108 about the circumference of the core 106. For example, each five degree arc segment about the circumference (360 degrees) of the core 106 should have an equal number of turns, such as fourteen.

Each of the half members 120, 122 includes a corresponding outer ring portion 124a, 124b that encircles an outer circumferential edge portion 126 of the current sensor 104. Each of the half members 120, 122 further includes a corresponding cylindrical central portion 128a, 128b that extends into the central opening 110 of the current sensor 104. Each of the half members 120, 122 also includes a corresponding disc portion 130a, 130b between the outer ring portion 124a, 124b and the cylindrical central portion 128a, 128b. Each of the disc portions 130a, 130b include a central aperture 110 into which a conductor operable to carry electrical current extends.

Each of the half members further includes a first rounded surface portion 132a, 132b between the outer ring portion 124a, 124b and the disc portion 130a, 130b and a second rounded surface portion 134a, 134b between the disc portion 130a, 130b and the cylindrical central portion 128a, 128b. Importantly, the shell 102 lacks any sharp or sudden seams or transitions about its surface profile, such that each of the half members 120, 122 has a continuous, seamless surface. Abrupt angles, like 90 degrees, can discourage flux from continuing through the shell 102, so the curved, smooth, rounded profile of the outer surface of the shell 102 presents no sharp angles or transitions for the magnetic flux emanating from the conductors passing through the central opening 110. Thus, the outer ring portions 124a, 124b seamlessly transition to the respective disc portions 130a, 130b at rounded portions 132a, 132b. Similarly, the tubular or cylindrical central portions 128a, 128b seamlessly transition to the respective disc portions 130a, 130b at rounded portions 134a, 134b. The rounded portions, 132a, 132b, 134a and 134b of the high-permeability shell 102 improve its performance by equalizing the coupling to the magnetic core 106 and winding from the three conductors 408. They also provide a path for magnetic flux from external magnetic fields generated by electrical currents (other than passing through the three conductors 408) and thereby shields the core 106 from this extraneous flux.

As mentioned above, the two half members 120, 122 are positioned adjacent to one another. An edge end 136a of the outer ring portion 124a of the first half member 120 contacts an edge end 136b of the outer ring portion 124b of the second half member 122. An edge end 138a of the cylindrical central portion 128a of the first half member 120 contacts an edge end 138b of the cylindrical central portion 128b of the second half member 122.

Figure 2:
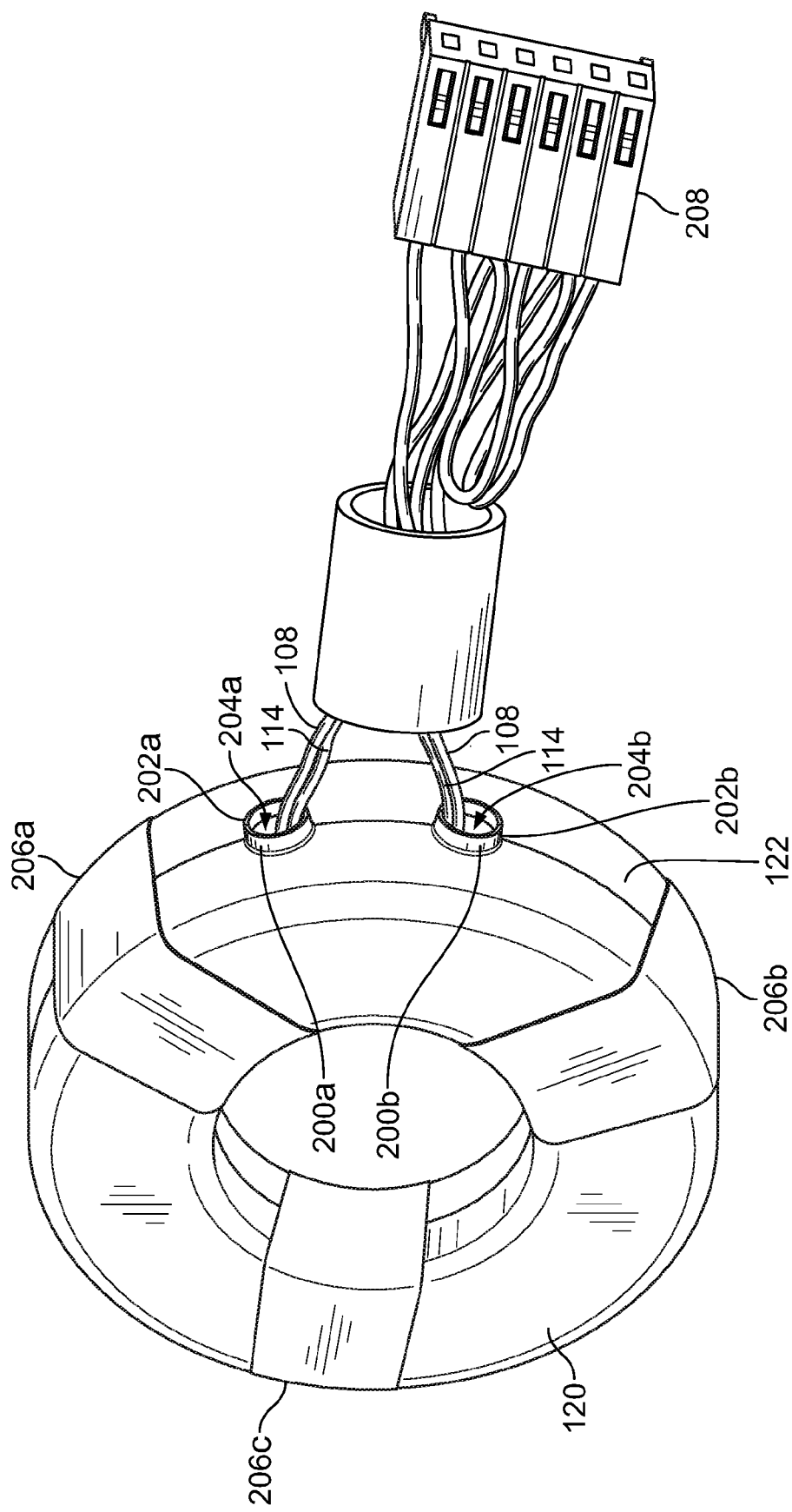
FIG. 2 is a perspective view of the current sensor assembly shown in FIG. 1 with the two half members secured together by tape and a pair of winding ends exiting corresponding apertures formed by notches in the two half members.

The first half member 120 includes a first notch or cut 140a and a second notch or cut 140b formed in the outer ring portion 124a. The first and second notches 140a, 140b are spaced apart from one another as shown in FIG. 1. A first end 112a of the secondary winding 108 is passed from the interior of the enclosure 102 to an exterior of the enclosure 102, as shown in FIG. 2. Those skilled in the art will appreciate that the secondary winding 108 is terminated inside the current sensor 104, and a wire lead connected to the thin wire wound around the toroidal core 106 exits the current sensor 104. This wire lead is considered part of the "secondary winding" as that term is used herein. The ends 112, 116 of the windings 108, 114 are received in a connector 208 that is connected to a ground-fault sensing circuit 404 (shown in FIG. 4).

Similarly, the second half member 122 includes a first notch or cut 142a and a second notch or cut 142b formed in the outer ring portion 124b. The first and second notches 142a, 142b are spaced apart from one another as shown in FIG. 1. A second end 112b (or lead wire) of the secondary winding 108 is passed from the interior of the enclosure 102 to the exterior of the enclosure 102, as shown in FIG. 2. When the two half members 120, 122 are positioned together, the first notches 140a, 142a form an aperture in the enclosure 102 through which one free end 112a of the secondary winding 108 is passed, and the second notches 140b, 142b also form another aperture in the enclosure 102 through which another free end 112b of the secondary winding is passed. Optionally, when the current sensor 104 is also wound with the test winding 114, a first end 116a of the test winding 114 is received through the aperture formed by the first notches 140a, 142a, and a second end 116b of the test winding 114 is received through the aperture formed by the second notches 140b, 142b.

As shown in FIG. 2, the notches 140a, 140b, 142a, 142b include respective flared-out edges 200a, 200b, 202a, 202b that extend away from an interior of the half members 120, 122 to present a smooth surface over which the windings 108, 114 pass. An otherwise sharp edge can undesirably cut into or otherwise compromise the insulation surrounding the windings 108, 114, potentially causing an inaccurate current reading.

Securing the two half members 120, 122 can be accomplished any number of ways. The two half members 120, 122 should form a tight, close-fitting interface at the respective edge ends 136a, 136b of the outer ring portions 124a, 124b and at the respective edge ends 138a, 138b of the cylindrical central portions 128a, 128b. In the illustrated example of FIG. 2, three, equidistantly spaced, pieces of tape 206a, 206b, 206c are wound around the half members 120, 122 to securely hold the two half members 120, 122 in place relative to one another around the current sensor 104. Alternately, the two half members 120, 122 can be glued or welded together, for example, or bound together with a binding material.

When the two half members 120, 122 are joined together, they together form a shell that encloses the current sensor 104. The two cylindrical central portions 128a, 128b form a tubular central portion that extends through the central opening 110 of the toroidal core 106 of the current sensor 104. The two outer ring portions 124a, 124b form an outer ring portion that encircles a corresponding outer circumferential surface portion 126 of the current sensor 104. The overall enclosure or shell 102 has a generally toroidal or donut shape. Except for the apertures 204a, 204b formed by the notches 140a, 140b, 142a, 142b, no part of the current sensor 104 is exposed to the environment as it is surrounded or encircled by the enclosure 102.

It has been found that the enclosure 102 when positioned over the current sensor 104 improves load-shift error by at least 500% compared to a current sensor without the enclosure 102 (a "naked" transducer). For example, tests were conducted on five "naked" transducers and four "shielded" transducers enclosed by an enclosure like the enclosure 102. The average percentage shift for the naked transducers was 38%, which dropped significantly to 5.3% when the enclosure 102 was positioned over the current sensor 104, resulting in over a 700% improvement. Percentage shift in this example corresponds to the absolute percentage difference in the current sensor output with 30 mA of ground fault current compared to the output of the current sensor with 30 mA of ground fault and 250 A of current flowing through two of the three phase conductors. Three phase conductors were placed through the central opening 110 of the current sensor 104. In addition to reducing load-shift error, the metal enclosure 102 also provides mechanical protection for the current sensor 104 against objects such as screwdrivers.

Figure 3:
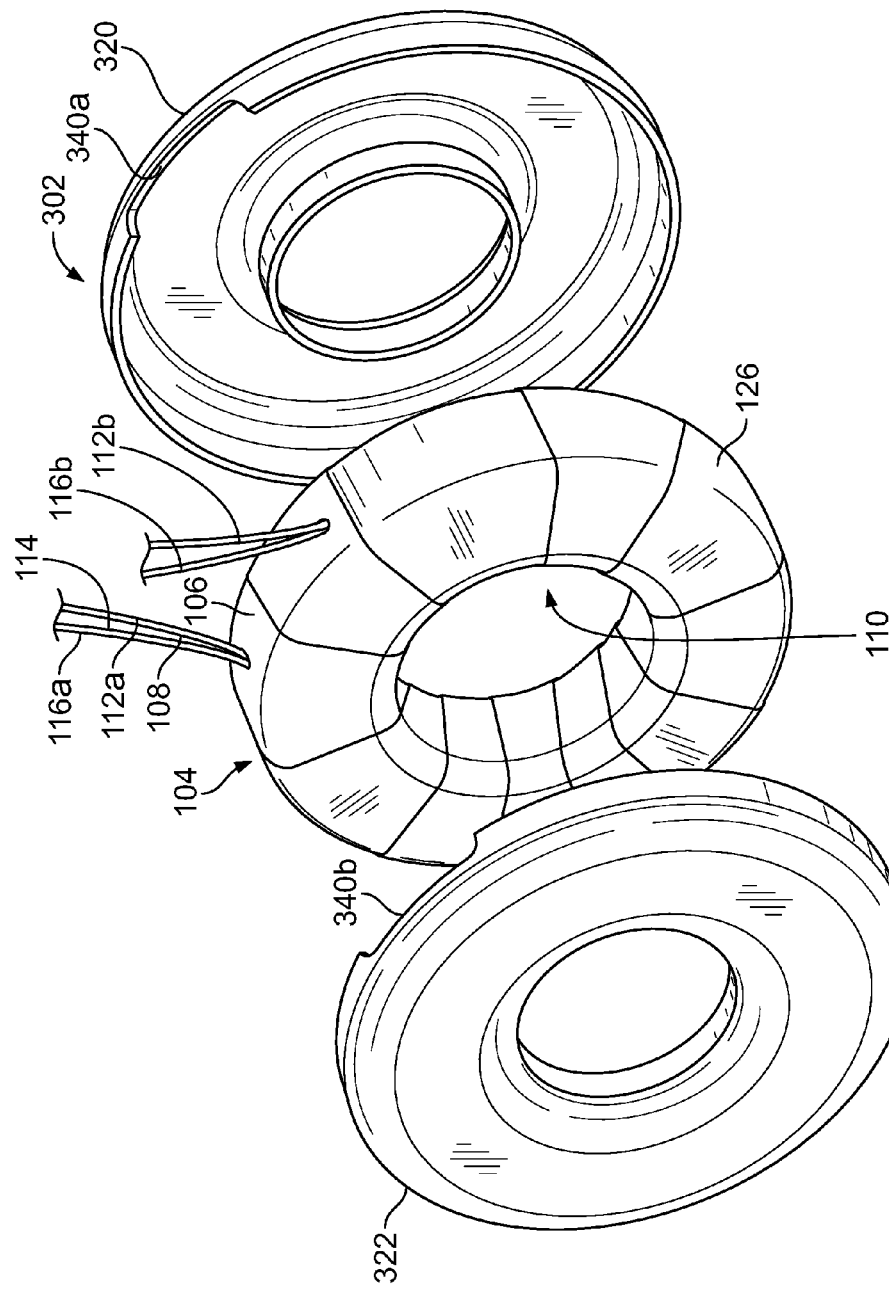
FIG. 3 is an exploded diagram of a different current sensor assembly than shown in FIG. 1 with only a single aperture for receiving one or more windings wound around the current sensor instead of two apertures.

FIG. 3 illustrates a slightly different enclosure 302 from the enclosure 102 in which a first half member 320 includes a single notch 340a formed in an outer ring portion 324a, which forms an aperture when a second half member 322 is positioned against the first half member 320. An identical notch 340b can be optionally formed in an outer ring portion 324b of the second half member 322. Making both half members 320, 322 mirror-images of one another simplifies manufacturing, though it is contemplated that only one of the half members can include a notch or cut-out for receiving one or more windings. The notches 340a,b can include flared-out edges like the notches 140a, 140b, 142a, 142b shown in FIG. 1, though these edges are not shown in FIG. 3. One or more windings (such as a secondary winding and optionally a test winding) are passed through the aperture formed by the notch 340. Thus, instead of two apertures, such as shown in FIG. 1, in this example, only one aperture is formed for receiving the winding ends. Having two apertures is preferred because they simplify assembly in that they avoid confusing the installer by ensuring that the installer connects the winding ends to the appropriate places in a connector 208 (shown in FIG. 2) that receives the winding ends. The enclosure 302 surrounds the current sensor 104 as described in connection with FIGS. 1 and 2 above. Except for the notches 340a, 340b, the shape, geometry, and composition of the enclosure 302 are otherwise the same as described above in connection with the enclosure 102 of FIGS. 1 and 2.

FIG. 4 is an exploded diagram of a portion of a ground fault module 400 in which the current sensor assembly 100 is installed. Although not every component shown in FIG. 4 is described herein, those of ordinary skill in the art will understand the unnamed components, which are not necessary to an understanding of the present disclosure. Three phase conductors 408a,b,c are passed through the current sensor assembly 100, each conductor 408 carrying a different phase of electrical current. Although three phase conductors are shown, two or more than three conductors can be used. For example, two line conductors and one neutral conductor can be received through the central opening 110 of the current sensor assembly 100, or one line conductor and one neutral conductor. During normal operating conditions, the sum of the currents flowing through the conductors passing through the current sensor assembly 100 should be very close to zero amps, or at least below a current that can harm humans. When a ground fault occurs, a current path is created from one conductor to ground (earth), creating an imbalance of current through the conductors. A ground-fault sensing circuit 404 causes the circuit breaker to trip when the sum of the currents sensed through the conductors by the current sensor assembly 100 exceeds a ground-fault threshold, such as 15 mA or 30 mA or 3 A, which is set by the ground-fault sensing circuit 404 and can be adjustable. Load-shift error can cause the ground-fault sensing circuit 404 to trip too prematurely or too late. The latter case can be very hazardous to other equipment and dangerous or even deadly to humans. The former case can be a nuisance.

The current sensor assembly 100 is secured into a base 406 of the ground fault module 400, and a cover 402 is positioned over the ground-fault sensing circuit 404 to house the sensing components. The one or more windings exiting the current sensor assembly 100 are connected to the ground-fault sensing circuit 404. If a test winding 114 is provided, the ground-fault sensing circuit 404 can simulate an imbalance in the current flowing through the conductors 408a,b,c by introducing a current through the test winding, thereby creating a ground-fault condition for testing the efficacy and accuracy of the ground-fault sensing circuit 404. Conventional lugs 410a, 410b, 410c receive the conductors carrying electrical current, which are electrically coupled to the conductors 408a,b,c passing through the current sensor assembly 100. A circuit breaker connected to the ground fault module 400 is operable to detect series and/or parallel arc faults in addition to other electrical faults. The ground-fault sensing circuit 404 can include a printed circuit board on which electronic components are conventionally disposed for electronically detecting a ground fault and optionally other electrical faults. The ground-fault sensing circuit 404 can be operable to detect a minimum ground-fault current between 30 mA and 3 A, and can have a continuous rating of 250 A or greater. The ground-fault current threshold can be adjustable by the ground-fault sensing circuit 404. The enclosure 102 is particularly useful in circuit breakers having adjustable ground-fault current thresholds because load-shift compensation circuitry or software does not need to be recalibrated for each threshold. The enclosure 102 operates to significantly reduce the load-shift error across a range of ground-fault currents, from 30 mA to 3 A, for example, eliminating the need to provide load-shift compensation across the range of adjustable ground-fault current thresholds.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. In a circuit breaker, an enclosure that surrounds a current sensor for sensing ground-fault current, comprising:
   a first half member and a second half member positioned adjacent one another to form a toroid that surrounds a toroidal core of the current sensor, the first half and the second half members each having:
      an outer ring portion that encircles a corresponding outer circumferential surface portion of the current sensor,
      a cylindrical central portion that extends into a central opening of the current sensor, and
      a disc portion between the outer ring portion and the cylindrical central portion, the disc portion including a central aperture into which a conductor operable to carry electrical current extends; and the enclosure further comprising a first aperture through which the secondary winding passes from an interior of the shell to an exterior of the shell for connection to a ground-fault sensing circuit in the circuit breaker.

2. The enclosure of claim 1, the first half and the second half members each further having a first rounded surface portion between the outer ring portion and the disc portion and a second rounded surface portion between the disc portion and the cylindrical central portion.

3. The enclosure of claim 1, wherein an edge end of the outer ring portion of the first half member contacts an edge end of the outer ring portion of the second half member, and wherein an edge end of the cylindrical central portion of the first half member contacts an edge end of the cylindrical central portion of the second half member.

4. The enclosure of claim 1, wherein the first and second half members are composed of a magnetic material having a permeability of at least 700 H/m.

5. The enclosure of claim 1, wherein the first and second half members are composed of steel and formed by metal stamping.

6. The enclosure of claim 1, the first half member further having a first notch in the outer ring portion of the first half member, the first notch defining the first aperture through which a first end of a secondary winding wound around the toroidal core passes from an interior of the enclosure to an exterior of the enclosure.

7. The enclosure of claim 6, the first half member further having a second notch in the outer ring portion of the first half member, the second notch defining a second aperture through which a first end of a test winding wound around the secondary winding passes from the interior to the exterior of the enclosure.

8. The enclosure of claim 7, wherein a second end of the secondary winding also passes through the first aperture or the second aperture, and wherein a second end of the test winding also passes through the first aperture or the second aperture.

9. The enclosure of claim 5, the second half member further having a second notch in the outer ring portion of the second half member, the first notch and the second notch defining the first aperture through which the first end of the secondary winding passes.

10. The enclosure of claim 1, wherein the first and second half members completely surround the toroidal core, and wherein the first half member is a mirror-image of the second half member.

11. The enclosure of claim 1, wherein each of the first and second half members has a continuous, seamless surface.

12. The enclosure of claim 1, wherein the enclosure improves a load-shift error associated with the current sensor by at least 500% compared to a current sensor without the enclosure.

13. In a circuit breaker, a current sensor assembly for sensing ground-fault current, comprising:

a current sensor having a toroidal core around which a secondary winding is wound for sensing electrical current operable to pass through current-carrying conductors that extend into a central opening of the toroidal core; and a shell that encloses the current sensor, the shell including:
an outer ring portion that encircles a corresponding outer circumferential surface portion of the current sensor,
a tubular central portion that extends through the central opening of the toroidal core, and
a first disc portion opposite a second disc portion, the first and second disc portions being disposed between the outer ring portion and the tubular central portion to form a substantially toroidal shape, wherein the outer ring portion seamlessly transitions to the first and second disc portions at respective rounded portions, and wherein the tubular central portion seamlessly transitions to the first and second disc portions at respective rounded portions to reduce magnetic flux induced by the electrical current passing through the conductors from coupling back to the conductors within the shell and thereby contributing to load-shift error.

14. The assembly of claim 13, wherein the shell improves the load-shift error associated with the current sensor by at least 500% compared to a current sensor without the shell.

15. The assembly of claim 1, further comprising a test winding wound around the secondary winding for applying a test current to the current sensor to produce a ground-fault condition.

16. The assembly of claim 15, wherein the shell further includes an aperture through which the test winding passes from an interior of the shell to an exterior of the enclosure for connection to a ground-fault sensing circuit in the circuit breaker.

17. The assembly of claim 16, wherein the enclosure further includes a second aperture through which the secondary winding passes from the interior to the exterior for connection to the ground-fault sensing circuit.

18. The assembly of claim 1, wherein the circuit breaker is operable to detect a minimum ground-fault current between 5 mA and 3 A, and the circuit breaker is rated at 250 A or greater.

19. In a circuit breaker, an enclosure that surrounds a current sensor for sensing ground-fault current, comprising:
a first half member and a second half member positioned adjacent one another to form a toroid that surrounds a toroidal core of the current sensor, the first half and the second half members each having:
an outer ring portion that encircles a corresponding outer circumferential surface portion of the current sensor,
a cylindrical central portion that extends into a central opening of the current sensor, and
a disc portion between the outer ring portion and the cylindrical central portion, the disc portion including a central aperture into which a conductor operable to carry electrical current extends,
the first half member further having a first notch in the outer ring portion of the first half member, the first notch defining a first aperture through which a first end of a secondary winding wound around the toroidal core passes from an interior of the enclosure to an exterior of the enclosure.

20. The enclosure of claim 19, further comprising a test winding wound around the secondary winding for applying a test current to the current sensor to produce a ground-fault condition.

21. In a circuit breaker, an enclosure that surrounds a current sensor for sensing ground-fault current, comprising:
a first half member and a second half member positioned adjacent one another to form a toroid that surrounds a toroidal core of the current sensor, the first half and the second half members each having:
an outer ring portion that encircles a corresponding outer circumferential surface portion of the current sensor,
a cylindrical central portion that extends into a central opening of the current sensor, and a disc portion between the outer ring portion and the cylindrical central portion, the disc portion including a central aperture into which a conductor operable to carry electrical current extends, wherein the enclosure improves a load-shift error associated with the current sensor by at least 500% compared to a current sensor without the enclosure.

22. In a circuit breaker, an enclosure that surrounds a current sensor for sensing ground-fault current, comprising:

a first half member and a second half member positioned adjacent one another to form a toroid that surrounds a toroidal core of the current sensor, the first half and the second half members each having:

an outer ring portion that encircles a corresponding outer circumferential surface portion of the current sensor, a cylindrical central portion that extends into a central opening of the current sensor, and a disc portion between the outer ring portion and the cylindrical central portion, the disc portion including a central aperture into which a conductor operable to carry electrical current extends; and the enclosure further comprising a test winding wound around the secondary winding for applying a test current to the current sensor to produce a ground-fault condition.

* * * * *